United States Patent
Jung

(10) Patent No.: US 9,490,259 B2
(45) Date of Patent: Nov. 8, 2016

(54) ANTI-FUSE, ANTI-FUSE ARRAY AND METHOD OF OPERATING THE SAME

(71) Applicant: SK hynix Inc., Gyeonggi-do (KR)

(72) Inventor: Yong Sun Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/795,787

(22) Filed: Jul. 9, 2015

(65) Prior Publication Data

US 2016/0300843 A1   Oct. 13, 2016

(30) Foreign Application Priority Data

Apr. 10, 2015  (KR) ................. 10-2015-0050988

(51) Int. Cl.
| | | |
|---|---|---|
| *G11C 17/00* | (2006.01) | |
| *G11C 17/16* | (2006.01) | |
| *H01L 27/112* | (2006.01) | |
| *G11C 17/18* | (2006.01) | |

(52) U.S. Cl.
CPC ......... *H01L 27/11206* (2013.01); *G11C 17/16* (2013.01); *G11C 17/18* (2013.01)

(58) Field of Classification Search
CPC ....... G11C 16/10; G11C 16/14; G11C 16/26; G11C 16/3427; G11C 2211/5612; G11C 17/16; G11C 13/0004; G11C 17/18
See application file for complete search history.

(56) References Cited

U.S. PATENT DOCUMENTS

| 9,196,377 | B1* | 11/2015 | Park ............... H01L 27/11206 |
| 2006/0244099 | A1* | 11/2006 | Kurjanowicz ......... G11C 17/16 257/530 |
| 2007/0257331 | A1 | 11/2007 | Kurjanowicz et al. |
| 2010/0244115 | A1 | 9/2010 | Kurjanowicz et al. |
| 2011/0312169 | A1 | 12/2011 | Kurjanowicz et al. |
| 2014/0015095 | A1 | 1/2014 | Hui et al. |

FOREIGN PATENT DOCUMENTS

| KR | 1020100055386 | 5/2010 |
| KR | 1020140009063 | 1/2014 |

\* cited by examiner

*Primary Examiner* — Hien Nguyen
(74) *Attorney, Agent, or Firm* — IP & T Group LLP

(57) ABSTRACT

An anti-fuse, an anti-fuse array and a method of operating the same are disclosed. The anti-fuse array includes: an active region formed in a semiconductor substrate; a slit region formed at both edge portions of the active region in a first direction; a plurality of select gates extending in a second direction perpendicular to the first direction of the active region, and coupled to a select word line; a plurality of first program gates spaced apart from the select gates, formed over the active region isolated by the slit region, and coupled to a first program word line; a plurality of second program gates spaced apart from the select gates, formed over the active region isolated by the slit region, and coupled to a second program word line; and a bit line perpendicular to the select word line.

24 Claims, 7 Drawing Sheets

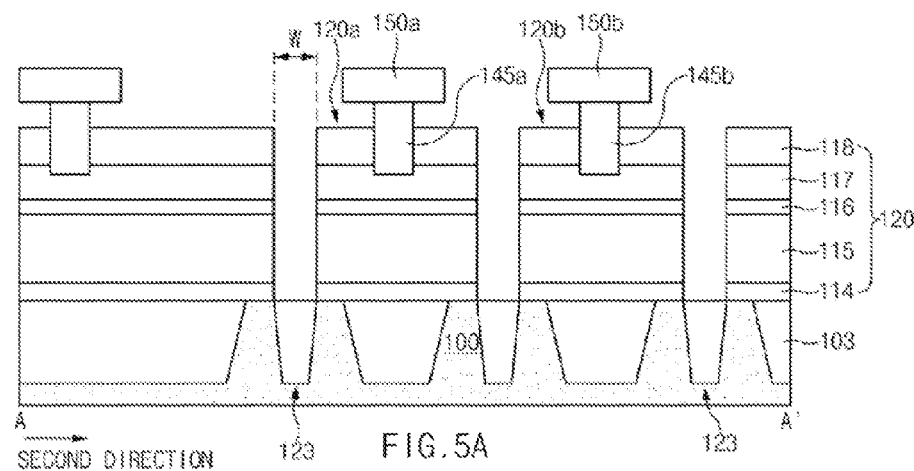
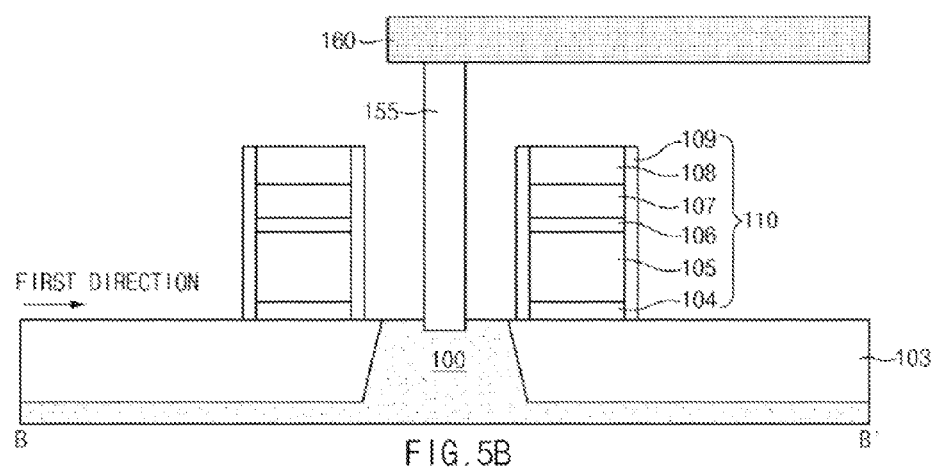
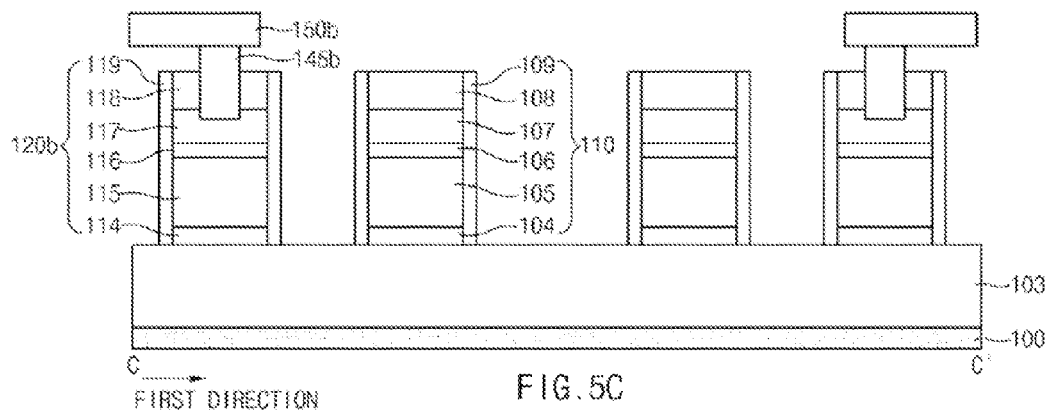

ANTI-FUSE, ANTI-FUSE ARRAY AND METHOD OF OPERATING THE SAME

CROSS-REFERENCE TO RELATED APPLICATION

The priority of Korean patent application No. 10-2015-0050988, filed on 10 Apr. 2015, the disclosure of which is hereby incorporated in its entirety by reference, is claimed.

BACKGROUND OF THE INVENTION

Embodiments of the present disclosure relate to an anti-fuse, an anti-fuse array and a method of operating the same and, more particularly, to an anti-fuse array having improved program efficiency.

An anti-fuse of a semiconductor device is initially in an insulated state and transforms to a conductive state when a voltage greater than its threshold voltage is applied. An anti-fuse includes a program transistor and a select transistor.

An anti-fuse array includes program transistors, select transistors, and bit lines. One program transistor, one select transistor, and one bit line are selected to program a target cell.

When a high voltage is applied to the program gate of the program transistor, the gate insulation film of the program gate ruptures due to the voltage difference between the high voltage program gate and the low voltage bit line. More specifically, a voltage sufficient for forming a conductive channel is applied to the select gate of the select transistor, transferring the program gate voltage. Then, the voltage difference between the program gate and the bit line acts on the gate insulation film. This results in the gate insulation film of the program gate rupturing, completing the program operation.

Anti-fuses allow for memory cell repairs to be performed at a package level, may increase the number of net dies, may improve product characteristics, and may overcome device and fabrication limitations that are present when using conventional laser fuses. Because of the above-mentioned characteristics of the anti-fuse, it is expected that anti-fuses will become more widely used in various technical fields.

For an anti-fuse to properly function, a high quality oxide film must be formed so that current does not leak unless the anti-fuse is programmed. In addition, after programming, it is important to ensure that the programming operation was a success (i.e. that the gate oxide film was properly ruptured).

As the number of necessary fuses increases and the size of each fuse increases, the chip area occupied by the anti-fuse also unavoidably increases. Therefore, it is always a goal to find ways to increase anti-fuse integration while maintaining performance characteristics.

BRIEF SUMMARY OF THE INVENTION

Various embodiments of the present disclosure are directed to providing an anti-fuse, an anti-fuse array and a method of operating the same that substantially obviate one or more problems, limitations and disadvantages of the related art.

An embodiment relates to an anti-fuse, an anti-fuse array and a method of operating the same in which a program gate of the anti-fuse is formed in an island shape so that improved program efficiency is achieved without increasing the size of the program gate area.

In accordance with an embodiment of the present disclosure, an anti-fuse includes: an active region formed in a semiconductor substrate; a slit region formed at both edges of the active region portions in a first direction; a select gate extending in a second direction perpendicular to the first direction of the active region; and a first program gate and a second program gate, which are spaced apart from the select gate and are arranged over the active region that is isolated by the slit region.

In accordance with another aspect of the present disclosure, an anti-fuse array includes: an active region formed in a semiconductor substrate; a slit region formed at both edge portions of the active region in a first direction; a plurality of select gates extending in a second direction perpendicular to the first direction of the active region, and coupled to a select word line; a plurality of first program gates spaced apart from the select gates, formed over the active region isolated by the slit region, and coupled to a first program word line; a plurality of second program gates spaced apart from the select gates, formed over the active region isolated by the slit region, and coupled to a second program word line; and a bit line perpendicular to the select word line.

In accordance with another aspect of the present disclosure, a method of operating an anti-fuse array includes: when a gate insulation film of at least one of a first program gate and a second program gate is ruptured, determining a programmed state of the corresponding program gate. The anti-fuse array includes an active region formed in a substrate; a slit region formed at both edge portions of the active region in a first direction; a plurality of select gates extending in a second direction perpendicular to the first direction of the active region, and coupled to a select word line; a plurality of first program gates spaced apart from the select gates, arranged over the active region isolated by the slit region, and coupled to a first program word line; a plurality of second program gates spaced apart from the select gates, arranged over the active region isolated by the slit region, and coupled to a second program word line; and a bit line perpendicular to the select word line.

It is to be understood that both the foregoing general description and the following detailed description are exemplary and explanatory and are intended to provide further explanation of the claims.

BRIEF DESCRIPTION OF THE DRAWINGS

FIGS. 3A to 5C are cross-sectional views illustrating a method of forming an anti-fuse according to an embodiment of the present disclosure.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. A detailed description of well-known or previously discussed configurations or functions will be omitted when it may make the subject matter less clear.

The anti-fuse has program characteristics in which the anti-fuse is initially in an insulative state and switches to a conductive state when a voltage greater than a threshold voltage is applied. An anti-fuse includes a program transistor and a select transistor.

Figure 1:
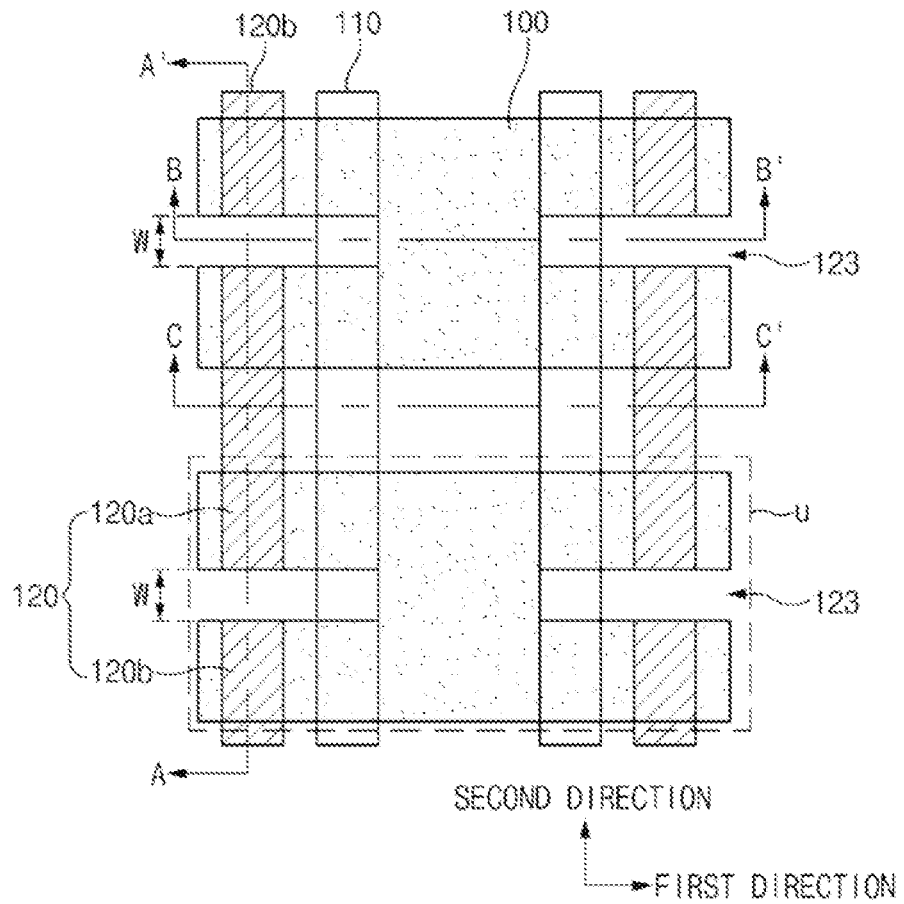
FIG. 1 is a layout diagram illustrating a fuse unit constructing an anti-fuse array according to an embodiment of the present disclosure.

FIG. 1 is a layout diagram illustrating a fuse unit U according to an embodiment of the present disclosure. In more detail, the fuse unit U having two unit cells is represented in a (1×2) shape.

The fuse unit U constructing the anti-fuse array includes a plurality of program gates 120 composed of n-channel type MOS transistors, and a plurality of select gates 110. Referring to FIG. 1, an active region 100 extends in a first direction, i.e., a horizontal direction. Although not shown in FIG. 1, the active region 100 may be defined by a device isolation layer. One active region 100 may include a center portion and at least one edge portion formed at one side or both sides of the center portion. The active regions 100 may be formed by isolating each edge portion through a slit region 123 under the condition that two adjacent center portions are connected. In other words, two adjacent center portions of the active region 100 are connected, and the active region 100 is divided into two parts by the slit region 123 at the edge portion of the active region 100. The slit region 123 may be formed at one side and the other side on the basis of the center portion of the active region 100, and extend in the first direction of the active region 100. For convenience, the active regions 100 formed by connecting two adjacent center portions will hereinafter be referred to as one active region.

The plurality of select gates 110 may be formed to cross the active region 100, The select gate 110 is formed in a line extending in a second direction that is traverse the direction of the active region 100, Two select gates 110 may be formed over one active region 100 on the basis of the center portion interposed therebetween. The select gate 110 may construct a gate of a select transistor configured to select a specific cell.

The plurality of program gates 120 may be spaced apart from each other by a predetermined distance in the first direction, and each program gate 120 is arranged at one side of the select gate 110, opposite to the center portion of the active region 100. The program gate 120 may construct a gate of a program transistor. The program gate 120 may be isolated in the second direction over the edge portion of the active region 100 isolated by the slit region 123. The isolated program gates 120 may include a first program gate 120a and a second program gate 120b.

Each of the first program gate 120a and the second program gate 120b may be formed in an island shape. The first program gate 120a and the second program gate 120b may be spaced apart from each other by a predetermined distance in the second direction by the slit region 123 of the active region 100. One side of the first program gate 120a and the other side of the second program gate 120b may be spaced apart from each other by a critical dimension (W) of the slit region 123 in the second direction.

Figure 2A:
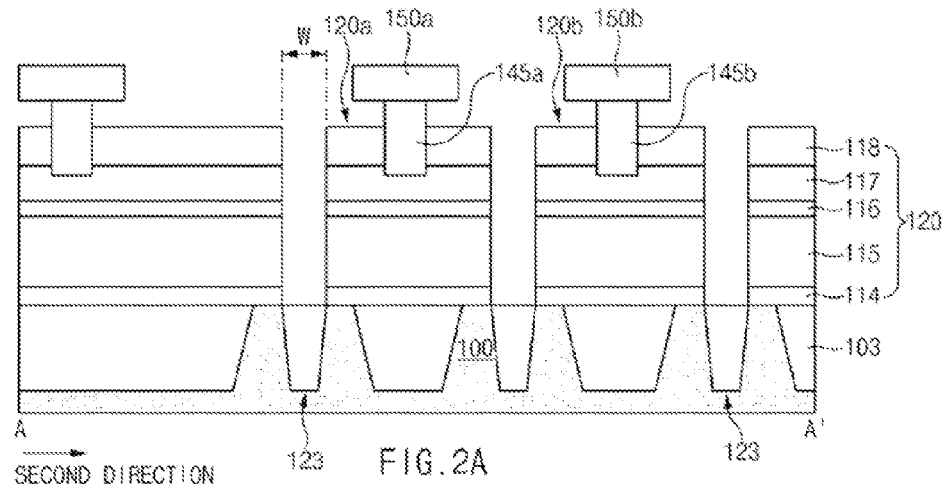
FIGS. 2A to 2C are cross-sectional views illustrating an anti-fuse according to an embodiment of the present disclosure.
Figure 2B:
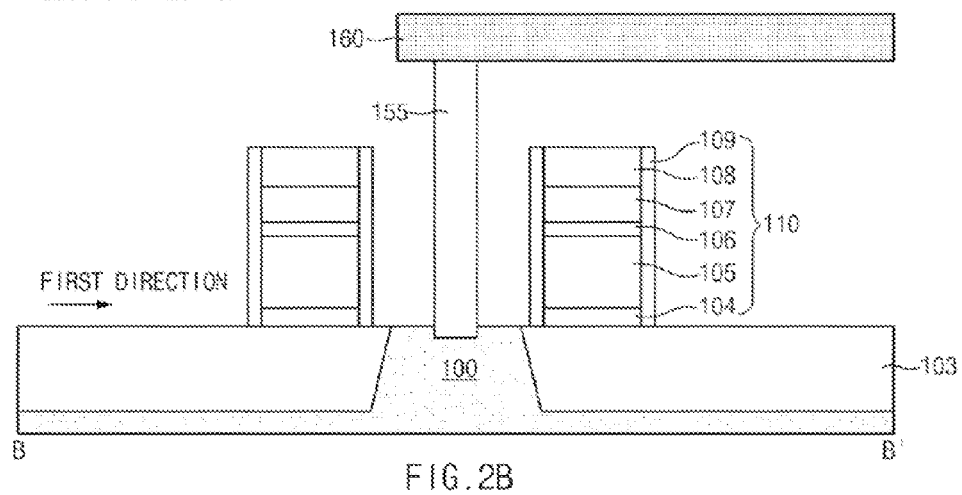
Figure 2C:
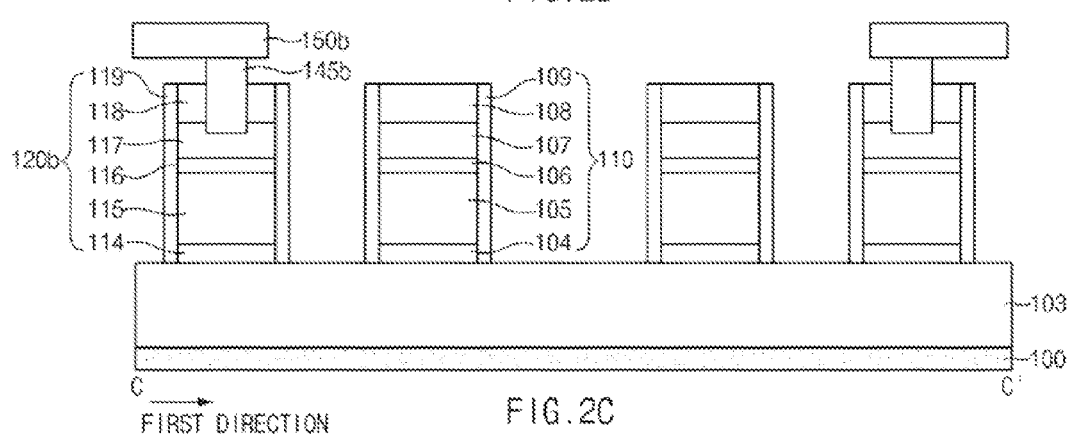

FIGS. 2A to 2C are cross-sectional views illustrating an anti-fuse according to an embodiment of the present disclosure. In more detail, FIG. 2A is a cross-sectional view illustrating the anti-fuse taken along the line A-A' of FIG. 1, FIG. 2B is a cross-sectional view illustrating the anti-fuse taken along the line B-B' of FIG. 1, and FIG. 2C is a cross-sectional view illustrating the anti-fuse taken along the line C-C' of FIG. 1.

Referring to FIGS. 2A to 2C, the anti-fuse includes a plurality of active regions 100, and each active region 100 may be defined by a device isolation film 103. One active region 100 may include a center portion and at least one edge portion formed at one side or both sides of the center portion. The active regions 100 may be formed by isolating each edge portion through the slit region 123 with two adjacent center portions connected to each other. In other words, two adjacent center portions of the active region 100 are connected, and the active region 100 is divided into two parts by the slit region 123 at the edge portion of the active region 100. For convenience, the active regions 100 formed by connecting two adjacent center portions will hereinafter be referred to as one active region.

A plurality of select gates 110 may be formed to cross the active region 100 (See FIGS. 2B and 2C). The select gate 110 is formed in a line extending in a second that is traverse the direction of the active region 100. Two select gates 110 may be formed over one active region 100 on the basis of the center portion interposed therebetween. The select gate 110 may construct a gate of a select transistor configured to select a specific cell. A plurality of select gates 110 may be spaced apart from each other in a first direction.

The select gate 110 may be formed of a conductive film 105, for example, a polysilicon layer or a metal layer. In addition, the select gate 110 may include a gate insulation film 104 disposed below the conductive film 105. The select gate 110 may include a barrier film 106, a tungsten silicide film 107, and a hard mask nitride film 108, which are sequentially deposited over the conductive film 105. The select gate 110 may include a spacer 109 deposited at sidewalls of the gate insulation film 104, the conductive film 105, the barrier film 106, the tungsten silicide film 107, and the hard mask nitride film 108.

Program gates 120 may be spaced apart from each other by a predetermined distance in the first direction, and each program gate 120 is arranged at one side of the select gate 110, opposite to the center portion of the active region. The program gate 120 may construct a gate of a program transistor. The program gates 120 may be isolated in the second direction over the edge portion of the active region 100 isolated by the slit region 123. The isolated program gates 120 may include a first program gate 120a and a second program gate 120b (See FIG. 2A).

The program gate 120 may be formed of a stacked structure and substantially the same materials as the select gate 110. The program gate 120 may be formed of a conductive film 115, for example, a polysilicon layer or a metal layer. In addition, the program gate 120 may include a gate insulation film 114 disposed below the conductive film 115. The program gate 120 may include a barrier film 116, a tungsten silicide film 117, and a hard mask nitride film 118, which are sequentially deposited over the conductive film 115. The program gate 120 may include a spacer 119 deposited at sidewalls of the gate insulation film 114, the conductive film 115, the barrier film 116, the tungsten silicide film 117 and the hard mask nitride film 118.

Each of the first program gate 120a and the second program gate 120b may be formed in an island shape. The first program gate 120a and the second program gate 120b may be spaced apart from each other by a predetermined distance in the second direction by the slit region 123 of the active region 100. One side of the first program gate 120a and the other side of the second program gate 120b may be spaced apart from each other by a critical dimension (W) of the slit region 123 in the second direction. The slit region 123 may be formed by a trench having the same depth as that of the device isolation film 103, and filling the trench with the same material as that of the device isolation film 103.

Each of the first program gate 120a and the second program gate 120b may overlap with adjacent active regions 100 in the second direction. A first contact 145a and a second contact 145b may be respectively coupled to the first program gate 120a and the second program gate 120b. A first metal line 150a is coupled to the first contact 145a, and a metal line 150b is coupled to the second contact 145b (See FIGS. 2A and 2C).

A bit line contact 155 may be disposed over the center portion of the active region 100, and a bit line 160 may be coupled to the bit line contact 155 (See FIG. 2B). The bit line 160 may be formed in an elongated line extending in the first direction, crossing the select gate 110.

FIGS. 3A to 5C are cross-sectional views illustrating a method of forming the anti-fuse shown in FIGS. 2A to 2C.

In FIGS. 3A to 5C, FIGS. 3A, 4A and 5A are cross-sectional views illustrating the anti-fuse taken along the line A-A' of FIG. 1, FIGS. 3B, 4B, and 5B are cross-sectional views illustrating the anti-fuse taken along the line B-B' of FIG. 1, and FIGS. 3C, 4C, and 5C are cross-sectional views illustrating the anti-fuse taken along the line C-C' of FIG. 1.

Figure 3A:
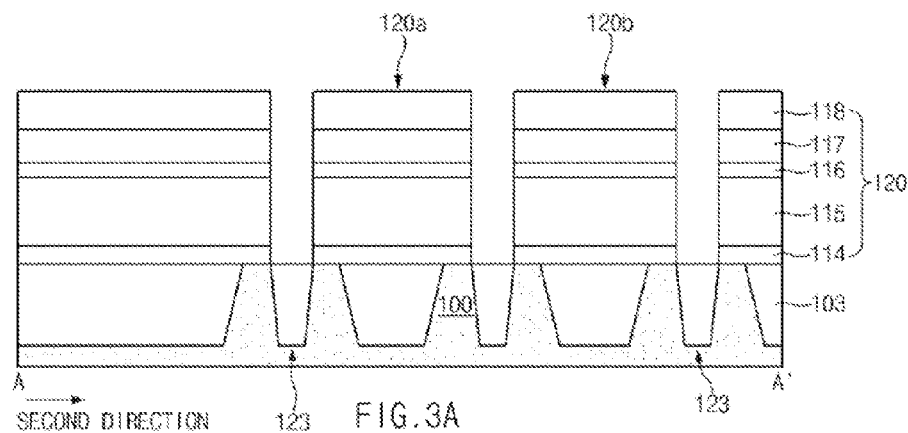
Figure 3B:
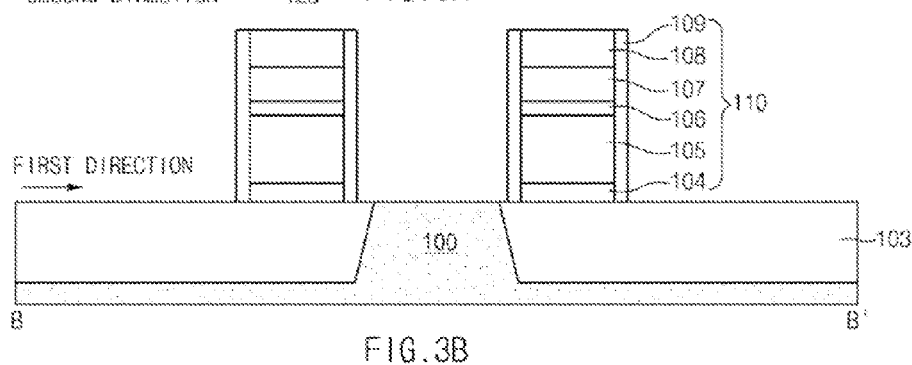
Figure 3C:
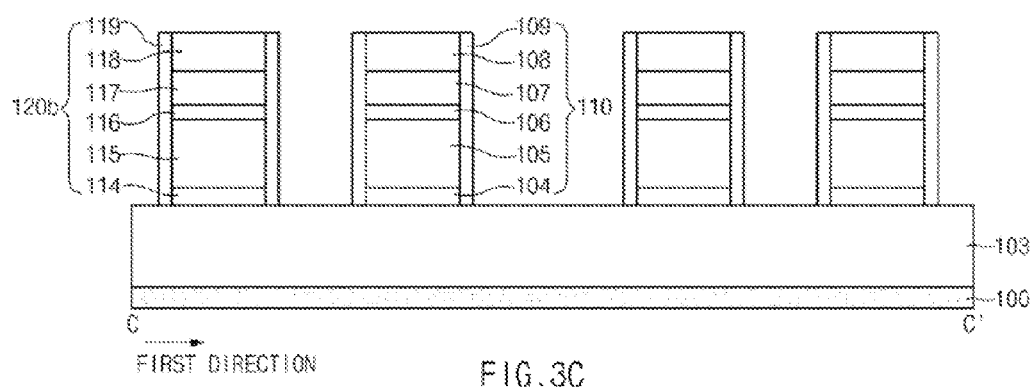

Referring to FIGS. 3A to 3C, gate insulation films 104 and 114, conductive films 105 and 115, barrier films 106 and 116, tungsten silicide films 107 and 117, and hard mask nitride films 108 and 118 are sequentially formed over a semiconductor substrate including an active region 100 and a device isolation film 103, thereby forming a gate stacked structure. In this case, a trench-shaped slit region 123 may be formed at the edge portion of the active region 100, and the slit region 123 may be filled with an insulation film in such a manner that the slit region 123 may have the same depth as that of the device isolation film 103. The gate insulation films 104 and 114 may be formed by performing thermal oxidation on the active region 100, or may be formed by depositing an oxide film over the active region 100. In addition, the conductive film 105 may be formed of a material including polysilicon or metal.

A first mask pattern (not shown) defining a gate pattern is formed over the gate stacked structure. Thereafter, the gate stacked structure is etched using the first mask pattern (not shown) as an etch mask, such that an elongated line-shaped gate pattern is formed to cross the active region 100.

After the first mask pattern (not shown) etched, a spacer material is deposited over an entire surface including a gate pattern. The spacer material may be formed of a nitride film. Thereafter, gate spacers 109 and 119 are formed at sidewalls of the gate pattern through an etch-back process, such that a select gate 110 and a program gate 120 are formed.

A second mask pattern (not shown) exposing some parts of the program gate 120 disposed over the active region 100 is formed over an entire surface including the program gate 120. The second mask pattern (not shown) may be formed to expose the slit region 123.

The line-shaped program gate 120 is etched using the second mask pattern (not shown) as an etch mask, and each of the first program gate 120a and the second program gate 120b may be formed in an island shape. In this case, the first program gate 120a and the second program gate 120b may be etched to expose the slit region 123. That is, the first program gate 120a and the second program gate 120b may be spaced apart from each other by a critical dimension (W) of the slit region 123 over the active region 100. Two program gates, i.e., a first program gate 120a and a second program gate 120b, may be spaced apart from each other on the basis of the slit region 123 interposed therebetween at an upper portion of one active region 100. The first program gate 120a and the second program gate 120b may be respectively formed over two adjacent active regions 100. Since two program gates 120a and 120b for a unit cell selected from one active region 100 may be controlled separately, the unit cell selected from one active region 100 may be programmed two times.

In addition, since the line-shaped program gate is formed in an independent island shape, the programming success rate may be doubled without increasing the size of the region.

Figure 4A:
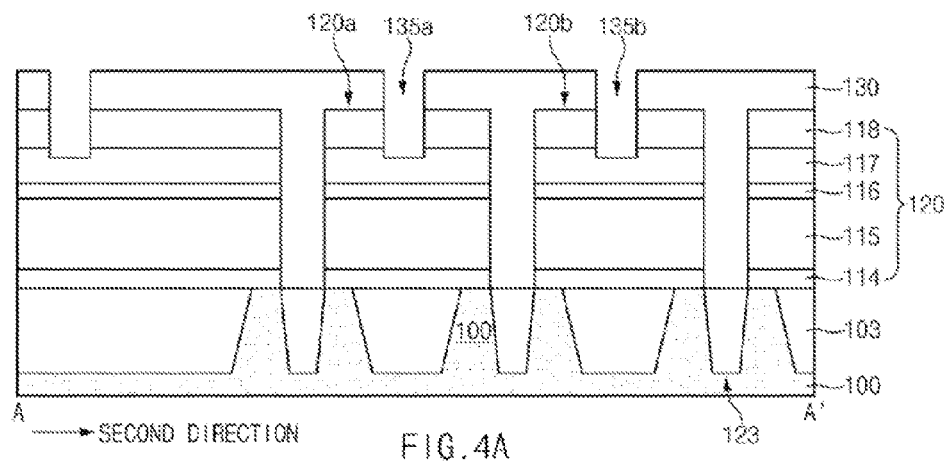
Figure 4B:
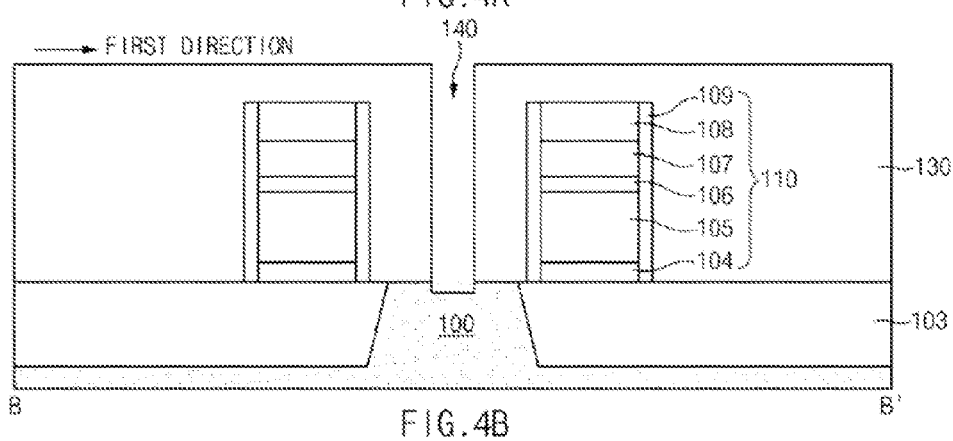
Figure 4C:
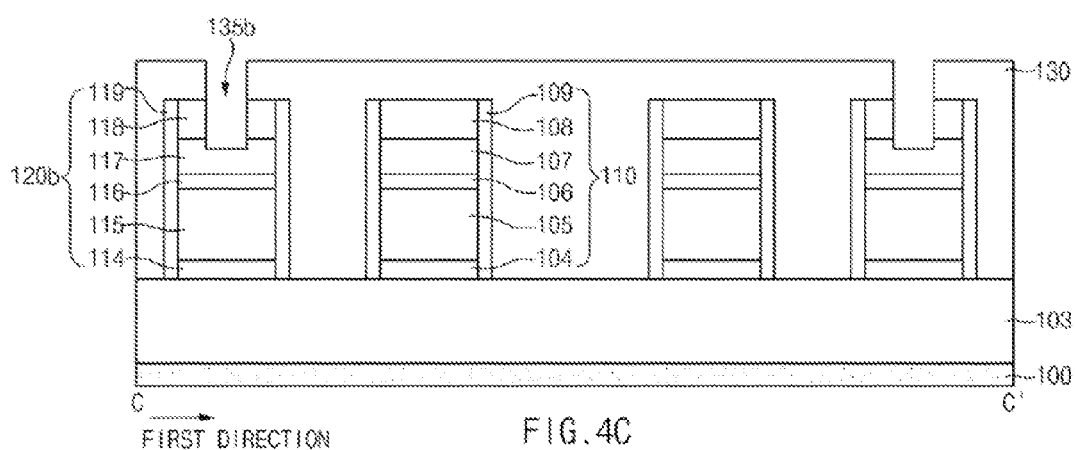

Referring to FIGS. 4A to 4C, after the second mask pattern (not shown) is etched, an interlayer insulation film 130 is formed over an entire surface of the semiconductor substrate including the select gate 110, the first program gate 120a, and the second program gate 120b.

The interlayer insulation film 130 may be formed of an oxide material. For example, the oxide material may be selected from a High-Density Plasma (HDP) oxide film, a Boron Phosphorus Silicate Glass (BPSG) film, a Phosphorus Silicate Glass (PSG) film, a Boron Silicate Glass (BSG) film, a Tetra-Ethyl-Ortho-Silicate (TEOS) film, a Undoped Silicate Glass (USG) film, a Fluorinated Silicate Glass (FSG) film, a Carbon Doped Oxide (CDO) film, and an Organo-Silicate Glass (OSG) film. In addition, the oxide material may be a stacked structure including at least two of the above-mentioned films. Alternatively, the oxide material may be formed of a spin-coated film such as a Spin-On Dielectric (SOD) film.

A third mask pattern (not shown) defining a contact region is formed over the interlayer insulation film 130. The interlayer insulation film 130, the hard mask nitride film 118 of the first program gate 120a, and the hard mask nitride film 118 of the second program gate 120b are etched using the third mask pattern (not shown) as an etch mask. Accordingly, a first contact hole 135a and a second contact hole 135b are formed to expose the tungsten silicide films 117 of the first program gate 120a and the second program gate 120b, respectively. In addition, a bit line contact hole 140 is formed to expose the center portion of the active region 100 interposed between the select gates 110.

Referring to FIGS. 5A to 5C, the first contact hole 135a, the second contact hole 135b, and the bit line contact hole 140 are filled with a conductive material. Accordingly, a first contact 145a, a second contact 145b, and a bit line contact 155 are formed.

A first metal line 150a and a second metal line 150b may be coupled to the first contact 145a and the second contact 145b, respectively. The first metal line 150a and the second metal line 150b may be formed in a line extending in a direction parallel to the select gate 110. The first metal line 150a and the second metal line 150l) may be used as a first program word line and a second program word line, respectively.

The first metal line 150a and the second metal line 150b may be coupled to the first contact 145a and the second contact 145b, respectively. That is, a plurality of first program gates 120a may be coupled to a single first metal line 150a through the first contact 145a, and a plurality of second program gates 120b may be coupled to a single second metal line 150b through the second contact 145b.

Thereafter, a bit line 160 may be coupled to the bit line contact 155. The bit line 160 crossing the select gate 110 may be formed in a line.

As described above, the selected cell formed over one active region includes two isolated program gates, i.e., the first program gate 120a and the second program gate 120b, and one program gate may extend across two adjacent active regions. Therefore, since two program gates may be simultaneously selected and programmed, the programming success rate may be doubled without increasing the size of the region.

Figure 6:
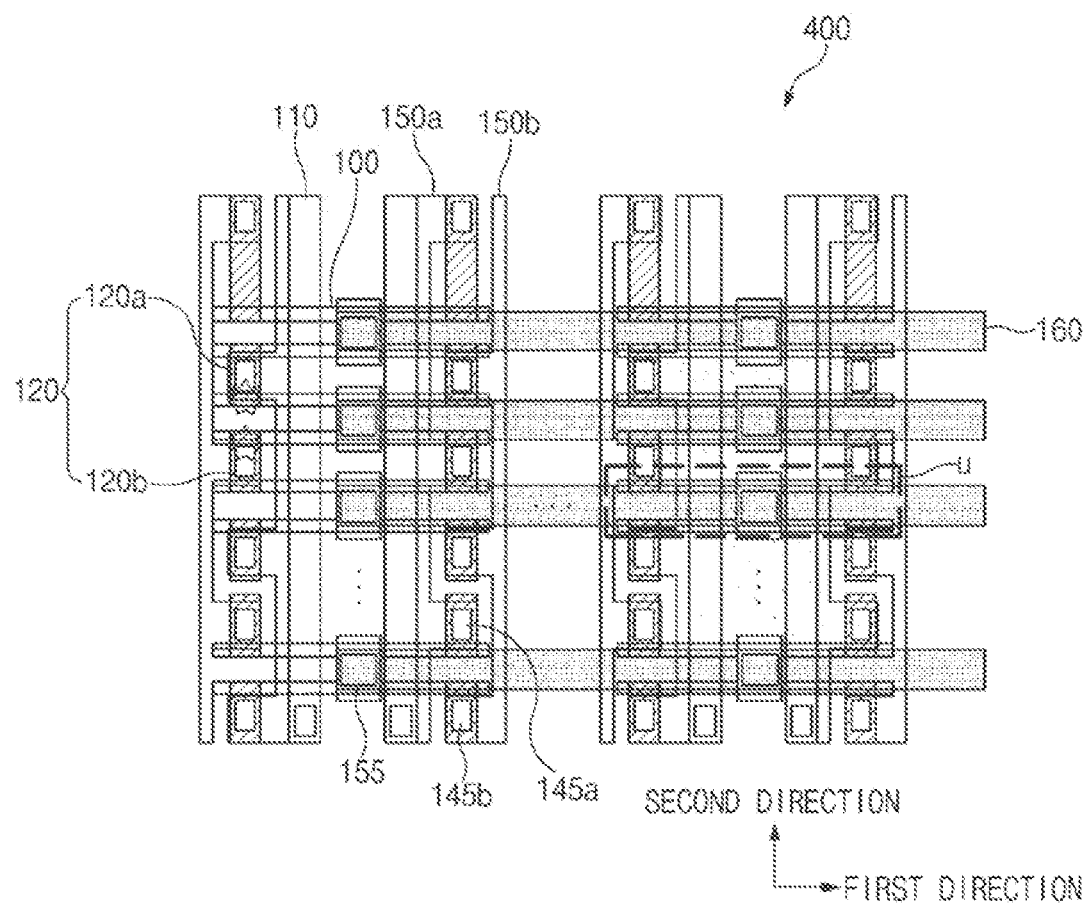
FIG. 6 is a layout diagram illustrating an anti-fuse array according to an embodiment of the present disclosure.

FIG. 6 is a layout diagram illustrating an anti-fuse array according to an embodiment of the present disclosure.

Referring to FIG. 6, the anti-fuse array 400 includes a plurality of fuse units U (shown in FIG. 1) arranged in an (n×m) array in the first and second directions. As can be seen from FIG. 1, the fuse unit U may include two unit cells that share only one active region and include a select gate 110 and a program gate 120 disposed at both sides of the active region on the basis of the center portion of the active region. As described above, the fuse unit U is repeatedly arranged in n rows and m columns, thereby forming an (n×m) matrix array.

The unit cells of adjacent fuse units U located in the same column may share the select gate 110 extending in a line in the second direction.

The program gates 120 are spaced apart from each other by a predetermined distance in the first direction toward one side of the select gate 110, opposite to the center portion of the active region.

Each program gate 120 is divided into a first program gate 120a and a second program gate 120b in one active region. The first program gate 120a and the second program gate 120b may be alternately arranged in the second direction, and each of the first program gate 120a and the second program gate 120b may be formed across the adjacent active regions arranged in the second direction. That is, one program gate 120 may be formed to overlap with two adjacent active regions. The first program gates 120a of the adjacent fuse units U arranged in the second direction may be coupled to a first metal line 150a through a first contact 145a. The second program gates 120b of the adjacent fuse units U arranged in the second direction may be coupled to a second metal line 150b through a second contact 145b. The first metal line 150a and the second metal line 150b may be respectively used as a first program word line and a second program word line.

In other words, two program gates, i.e., the first and second program gates 120a and 120b, formed in one active region are coupled to different metal lines, i.e., the first and second metal lines 150a and 150b. Accordingly, a program state of the anti-fuse may be separately adjusted through two program gates. Therefore, two program gates are simultaneously selected and the selected two program gates are programmed, without increasing the cell region.

The first metal line 150a may be coupled to the first contacts 145a coupled to the first program gate 120a. The first metal line 150a may be located at one side of each of the first program gate 120a and the second program gate 120b in the first direction, and may extend linearly in the second direction.

In addition, the second metal line 150b may be coupled to the second contacts 145b coupled to the second program gate 120b, and may be located at the other side of each of the first program gate 120a and the second program gate 120b in the first direction.

In this case, since a cross-sectional view of the first metal line 150a and the second metal line 150b and a cross-sectional view of the first contact 145a and the second contact 145b are not arranged in a straight line, the first metal line 150a may further include an extension part that is elongated to the first program gate 120a from the first contact 145a in the first direction. The second metal line 150b may further include an extension part that is elongated to the second program gate 120b from the second contact 145b in the first direction.

The first program gate 120a may be coupled to the first metal line 150a through the extension part coupled to the first contact 145a, and the second program gate 120b may be coupled to the second metal line 150b through the extension part coupled to the second contact 145b, The first metal line 150a and the second metal line 150b may be arranged at both sides of the first program gate 120a and the second program gate 120b, and the extension parts of the first metal line 150a and the second metal line 150b may be respectively arranged over the first program gate 120a and the second program gate 120b.

A bit line contact 155 may be arranged at the center portion of the active region contained in the fuse unit U, and a bit line 160 coupled to the bit line contact 155 may also be arranged at the center portion of the active region. The bit line contacts 155 of the fuse units U located at the same row may be coupled to one bit line 160, That is, the fuse units U located at the same row may share the bit line 160.

The bit line 160 may extend linearly in the first direction crossing the select gate 110, and may pass between the first program gate 120a and the second program gate 120b.

When a high voltage is applied to the first program gate 120a and the second program gate 120b of the cell selected from the above-mentioned anti-fuse array and a turn-on voltage for the select gate 110 is applied to the select gate 110, a channel region is formed below the select gate 110 and gate insulation films of the first and second program gates 120a and 120b are ruptured due to the voltage difference between the high voltage applied to the first and second program gates 120a and 120b and a low voltage applied to the bit line 160.

The high voltage and the low voltage applied to the selected cell to program the cell of the anti-fuse array are not fixed, and may be set to any voltage through which gates of the first and second program gates 120a and 120b may be ruptured due to a difference between the two voltages.

Figure 7:
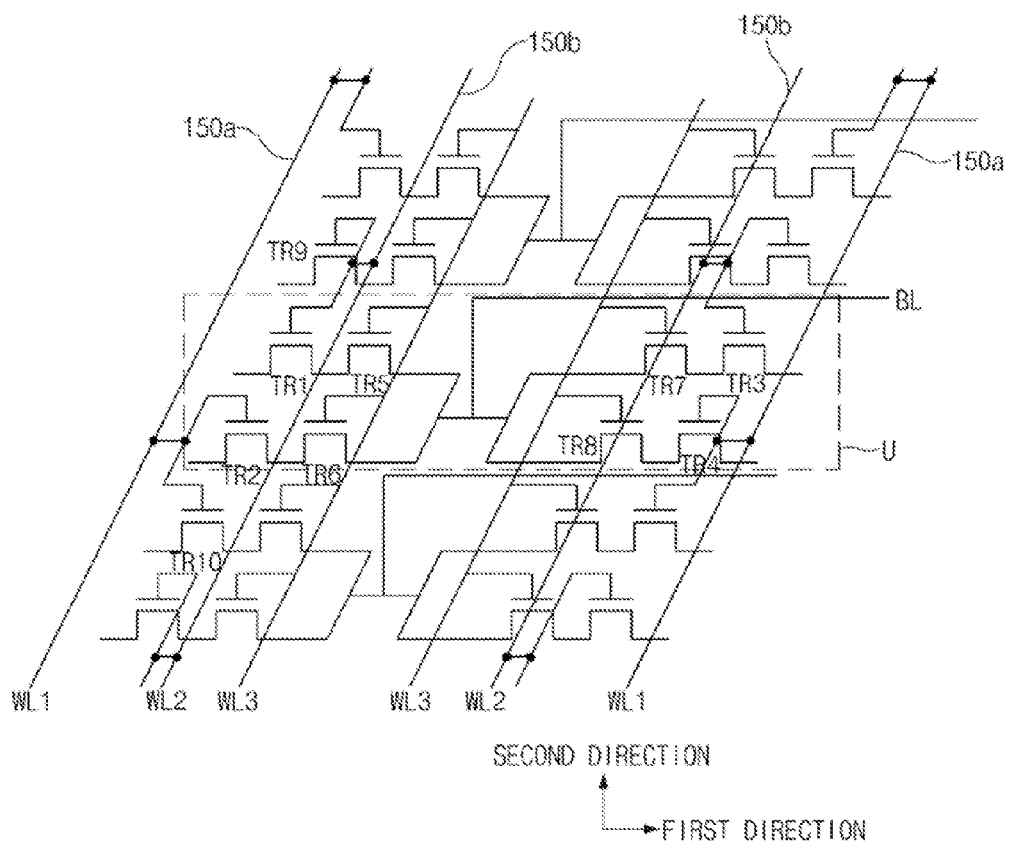
FIG. 7 is an equivalent circuit diagram illustrating an anti-fuse array of a semiconductor device according to an embodiment of the present disclosure.

FIG. 7 is an equivalent circuit diagram illustrating an anti-fuse array of a semiconductor device according to an embodiment of the present disclosure.

Referring to FIG. 7, the anti-fuse array may include a plurality of program word lines WL1 and WL2, a plurality of select word lines WL3, a plurality of bit lines BL, and a plurality of fuse units U. For convenience, it is assumed that several fuse units U have a (1×3) structure in which the fuse units U extend and are repeatedly arranged in the second direction.

One fuse unit U may include four program transistors TR1 to TR4 and four select transistors TR5 to TR8. The fuse unit U may be formed as shown in FIG. 1 or FIGS. 2A to 2C.

The first program transistor TR1 and the first select transistor TR5 arranged in the same row within the fuse unit U may be arranged in parallel in the first direction. Likewise, the second program transistor TR2 and the second select transistor TR6 arranged in the same row may be arranged in parallel in the first direction.

Several select word lines WL may extend in the second direction. The select word lines WL3 may be coupled to gate terminals of respective select transistors TR5 to TR8 located in the same column within each fuse unit U. Gate terminals of the first program transistor TR1 and a program transistor TR9 which is disposed in an adjacent fuse unit U in the second direction may be commonly coupled to the second program word line WL2. Likewise, gate terminals of the second program transistor TR2 and a program transistor TR10 which is disposed in an adjacent fuse unit U in the second direction may be commonly coupled to the first program word line WL1.

In addition, the bit line BL connected through the bit line contact may be arranged between the select transistors TR5 to TR8 of the fuse unit U. The bit line BL extends in the first direction, and may be arranged to pass between the first program transistors TR1 and TR3 and the second program transistors TR2 and TR4 in a single fuse unit U.

When four program transistors TR1 to TR4 and four select transistors TR5 to TR8 are contained in one fuse unit U, the above transistors TR1 to TR8 are combined in transistor pairs, such that the transistors TR1 to TR8 are horizontally symmetrical. For example, two program transistors TR1, and TR2 and two select transistors TR5 and TR6 are arranged at one side with respect to the bit line contact, and two program transistors TR3 and TR4 and two select transistors TR7 and TR8 are arranged at the other side with respect to the bit line contact.

Table 1 illustrates voltage conditions needed for the operations of the anti-fuse array shown in FIGS. 6 and 7. The operations of the anti-fuse array will hereinafter be described with reference to FIG. 6, FIG. 7, and Table 1.

TABLE I

| | FIRST PROGRAM GATE | | SECOND PROGRAM GATE | |
|---|---|---|---|---|
| | SELECTED | UN-SELECTED | SELECTED | UN-SELECTED |
| (a) PROGRAM OPERATION | High | Low | Mid | Low |
| (b) PROGRAM OPERATION | Mid | Low | High | Low |
| (c) READ OPERATION | Mid | Low | Mid | Low |

| | SELECT GATE | | BIT LINE | |
|---|---|---|---|---|
| | SELECTED | UN-SELECTED | SELECTED | UN-SELECTED |
| (a) PROGRAM OPERATION | Mid | Low | Low | Mid |
| (b) PROGRAM OPERATION | Mid | Low | Low | Mid |
| (c) READ OPERATION | Mid | Low | Low | Mid |

In accordance with the program operation (a) shown in Table 1, a gate insulation film of the first program gate 120a of the selected cell is ruptured and a program operation is then performed. A high voltage (High) is applied to the first program gate 120a, and a voltage lower than the high voltage is applied to the second program gate 120b. In this case, the gate insulation film of the second program gate 120b is not ruptured by the voltage applied to the second program gate 120b since the difference between the voltage applied to the second program gate 120b and a voltage applied to the bit line 160 is not enough to rupture the second program gate 120b. The voltage applied to the second program gate 120b is exemplarily set to a middle voltage (Mid) as shown in Table 1. In accordance with one embodiment, a high voltage (High) needed for the above program operation may about 4V to 6V, for example, a voltage of 5V. In addition, a low voltage (Low) may be a voltage of about 1V to 3V, for example, a voltage of 2.5V.

When a turn-on voltage for the select gate 110, e.g., the middle voltage (Mid), is applied to the select gate 110 of the selected cell, a channel region is formed below the select gate 110 and the select gate 110 is turned on. When a low voltage (Low) is applied to the bit line 160, a gate insulation film of the first program gate 120a is ruptured by a difference in voltage between the first program gate 120a and the bit line 160. Accordingly, the first program gate 120a is short-circuited and then programmed. However, in the second program gate 120b, since a difference between the low voltage (Low) applied to the bit line 160 and the middle voltage (Mid) applied to the second program gate 120b is not enough, the gate insulation film of the second program gate 120b is not ruptured. Therefore, the second program gate 120b is not programmed whereas the first program gate 120a formed over one active region is programmed.

In accordance with the program operation (b) shown in Table 1, a high voltage (High) is applied to the second program gate 120b of the selected cell, and a voltage incapable of rupturing the gate insulation film of the first program gate 120a is applied to the first program gate 120a. In the same manner as in the program operation (a), the voltage applied to the first program gate 120a is exemplarily denoted by a middle voltage (Mid) as shown in Table 1.

When a turn-on voltage for the select gate 110, e.g., the middle voltage (Mid), is applied to the select gate 110 of the selected cell, the select gate 110 is turned on. When a low voltage is applied to the bit line 160, a gate insulation film of the second program gate 120b is ruptured by a difference in voltage level between the second program gate 120b and the bit line 160. Accordingly, the second program gate 120b may be programmed.

In accordance with the program operation (b), a gate insulation film of the first program gate 120a is not ruptured in one active region, whereas a gate insulation film of the second program gate 120l) is ruptured in one active region.

Although the first program operation (a) and the second program operation (b) have shown that a high voltage is applied to the first program gate 120a or the second program gate 120b a high voltage may be applied to both the first and second program gates 120a and 120b so that both of the fuses may be programmed.

In accordance with the read operation (c) shown in Table 1, when a turn-on voltage for the select gate 110, e.g., the middle voltage (Mid), is applied to the select gate 110, the select gate 110 is turned on, and a read voltage is applied to the first program gate 120a and the second program gate 120b. Since there is a difference between the read voltage applied to each program gate 120a or 120b and the low voltage applied to the bit line 160, the read voltage applied to each program gate 120a or 120b may determine whether the selected cell coupled to the bit line 160 is programmed based on a current path formed along the channel region of the select gate 110.

Therefore, during the read operation, when at least one program gate from among the first and second program gates 120a and 120b is programmed, i.e., is short-circuited, the voltage applied to the first and second program gates 120a and 120b is applied to the bit line 160 so that it may be determined whether programming was performed. When both of the first and second program gates 120*a* and 120*b* are not programmed, a current path for the bit line 160 is not formed.

In order to program a selected cell according to the above-mentioned operation principles, one first program gate 120*a*, one second program gate 120*b*, the select gate 110, and the bit line 160 may be selected. When a high voltage (High) is applied to the first program gate 120*a* and the second program gate 120*b* of the selected cell and a turn-on voltage for the select gate 110, e.g., the middle voltage (Mid), is applied to the select gate 110, a channel region is formed below the select gate 110. Due to the difference between the high voltage (High) applied to the first and second program gates 120*a* and 120*b* and the low voltage (Low) applied to the bit line 160, a gate insulation film of the first and second program gates 120*a* and 120*b* is ruptured.

Meanwhile, since a low voltage is applied to the program gate of the remaining unselected cells in such a manner that only the program gate of the selected cell may be programmed, there is no difference between the low voltage applied to the program gates of each unselected cell and the low voltage applied to the bit line.

In addition, since a turn-on voltage is applied to a select gate in such a manner that only the select gate of the selected cell is turned on, and a low voltage is applied to the select gate of the remaining unselected cells, the select gate may be turned off. In this case, the turn-on voltage applied to the select gate 110 may be lower than the high voltage applied to the program gate, and may be greater than the low voltage applied to the bit line.

As described above, two program gates, i.e., the first program gate 120*a* and the second program gate 120*b*, are arranged in one active region, and one program gate may be successively arranged along two adjacent active regions. Therefore, since two program gates may be simultaneously selected and programmed, the two program gates may be selected without increasing the cell area and the programming success rate may be doubled as compared to the conventional art.

As is apparent from the above description, two program gates isolated from each other are configured to overlap in one active region, and a program state of the anti-fuse may be independently adjusted through two program gates. Therefore, since two program gates are simultaneously selected and programmed, the two program gates may be selected without increasing the chip area utilized, and the programming success rate may be doubled as compared to the conventional art.

In addition, since the program gate has a modified shape, two program gates can simultaneously operate without increasing the size of the cell area as compared to the conventional art. As a result, the programming success rate may increase without increasing the size of the chip area that is used.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching, polishing, and patterning steps described herein. Nor are embodiments limited to any specific type of semiconductor devices. For example, embodiments may be implemented in a dynamic random access memory (DRAM) device or non-volatile memory device. Other additions, subtractions, or modifications are obvious in view of the present disclosure and are intended to fall within the scope of the appended claims.

What is claimed is:

1. An anti-fuse comprising:
   an active region formed in a semiconductor substrate,
   a slit region formed at both edge portions of the active region in a first direction;
   a select gate extending in a second direction perpendicular to the first direction of the active region; and
   a first program gate and a second program gate, which are spaced apart from the select gate and are arranged over the active region isolated by the slit region.

2. The anti-fuse according to claim 1, wherein the slit region is formed at one side and another side on the basis of a center portion of the active region, and extends in the first direction of the active region.

3. The anti-fuse according to claim 1, wherein the select gate is arranged over the active region isolated by the slit region, and is formed in a line extending in the second direction.

4. The anti-fuse according to claim 1, wherein the first program gate and the second program gate are spaced apart from a center portion of the active region by a predetermined distance in the first direction, and are alternately arranged in the second direction.

5. The anti-fuse according to claim 1, wherein the first program gate and the second program gate are spaced apart from each other by a critical dimension of the slit region in the second direction.

6. The anti-fuse according to claim 1, wherein each of the first program gate and the second program gate is arranged to overlap with adjacent active regions arranged in the second direction.

7. The anti-fuse according to claim 1, wherein the select gate, the first program gate, and the second program gate are symmetrical on the basis of a center portion of the active region.

8. The anti-fuse according to claim 1, wherein each of the select gate, the first program gate, and the second program gate includes:
   a gate insulation film formed over the semiconductor substrate;
   a conductive film formed over the gate insulation film; and
   a hard mask formed over the conductive film.

9. An anti-fuse array comprising:
   an active region formed in a semiconductor substrate;
   a slit region formed at both edge portions of the active region in a first direction;
   a plurality of select gates extending in a second direction perpendicular to the first direction of the active region, and coupled to a select word line;
   a plurality of first program gates spaced apart from the select gates, formed over the active region isolated by the slit region, and coupled to a first program word line;
   a plurality of second program gates spaced apart from the select gates, formed over the active region isolated by the slit region, and coupled to a second program word line; and
   a bit line perpendicular to the select word line.

10. The anti-fuse array according to claim 9, wherein the select word line is formed in a line extending in the second direction.

11. The anti-fuse array according to claim 9, wherein the first program gate and the second program gate are spaced apart from the select gates in the first direction.

12. The anti-fuse array according to claim 9, wherein the first program gate and the second program gate are isolated from each other by the slit region in the second direction.

13. The anti-fuse array according to claim 9, wherein the first program gate and the second program gate are successively arranged in the second direction in an alternate manner.

14. The anti-fuse array according to claim 9, wherein each of the first program gate and the second program gate is arranged to overlap with adjacent active regions arranged in the second direction.

15. The an use array according to claim 9, further comprising:
a first contact and a second contact respectively coupled to the first program gate and the second program gate.

16. The anti-fuse array according to claim 15, wherein:
the first program gate is coupled to the first program word line through an extension portion coupled to the first contact; and
the second program gate is coupled to the second program word line through an extension portion coupled to the second contact.

17. The anti use array according to claim 16, wherein:
the first program word line and the second program word line are arranged at both sides of the first program gate and the second program gate; and
the extension portions f the first program word line and the second program word line are respectively arranged over the first program gate and the second program gate.

18. The anti-fuse array according to claim further comprising:
a bit line contact formed at a center portion of the active region.

19. The anti-fuse array according to claim 18, wherein the bit line is coupled to the bit line contact, and is arranged to pass between the first program gate and the second program gate.

20. A method of operating an anti-fuse array which includes an active region formed in a substrate; a slit region formed at both edge portions of the active region in a first direction; a plurality of select gates extending in a second direction perpendicular to the first direction, and coupled to a select word line; a plurality of first program gates spaced apart from the select gates, arranged over the active region isolated by the slit region, and coupled to a first program word line; a plurality of second program gates spaced apart from the select gates, arranged over the active region isolated by the slit region, and coupled to a second program word line; and a bit line perpendicular to the select word line comprising:
when a gate insulation film of at least one of the first program gate and the second program gate is ruptured, determining a programmed state of the corresponding program gate.

21. The method according to claim 20, further comprising:
programming at least one of the first program gate and the second program gate by applying a high voltage to at least one of the first program gate and the second program gate of a selected cell, and rupturing the gate insulation film of at least one of the first program gate and the second program gate in response to a voltage difference between the high voltage and a voltage applied to the bit line.

22. The method according to claim 20, further comprising:
applying an equivalent voltage to the first program gate and the second program gate, and determining whether the corresponding program gate is programmed based on the bit line.

23. The method according to claim 20, further comprising:
forming a current path between the bit line and at least one of the first program gate and the second program gate through channel region formed below the select gates, in response to a voltage applied to the select gates.

24. The method according to claim 23, further comprising:
applying a voltage lower than the voltage applied to the select gates of the selected cell to the select gate of an unselected cell in such a manner that no channel region is formed in the select gate of the unselected cell and no current path is formed through the select gate of the unselected cell.

* * * * *